(12) United States Patent
Yoo et al.

(10) Patent No.: US 8,916,913 B2
(45) Date of Patent: Dec. 23, 2014

(54) HIGH VOLTAGE SEMICONDUCTOR DEVICE AND THE ASSOCIATED METHOD OF MANUFACTURING

(75) Inventors: Ji-Hyoung Yoo, Cupertino, CA (US); Lei Zhang, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 13/549,319

(22) Filed: Jul. 13, 2012

(65) Prior Publication Data

US 2014/0015017 A1      Jan. 16, 2014

(51) Int. Cl.
*H01L 29/78* (2006.01)

(52) U.S. Cl.
USPC ........... 257/288; 257/401; 257/341; 257/491; 257/492; 257/493; 257/343; 257/335; 257/287

(58) Field of Classification Search
CPC ...................................................... H01L 29/78
USPC ................. 257/288, 341, 401, 343, 335, 287, 257/E29.256, E29.066, 491, 492, 493
See application file for complete search history.

(56) References Cited

U.S. PATENT DOCUMENTS

| | | | | |
|---|---|---|---|---|
| 5,517,046 A | * | 5/1996 | Hsing et al. | 257/336 |
| 5,844,275 A | * | 12/1998 | Kitamura et al. | 257/335 |
| 2012/0235232 A1 | * | 9/2012 | Mallikarjunaswamy et al. | 257/335 |
| 2012/0280317 A1 | * | 11/2012 | Lee et al. | 257/335 |
| 2012/0286359 A1 | * | 11/2012 | Lin et al. | 257/335 |

* cited by examiner

*Primary Examiner* — Chuong A Luu
(74) *Attorney, Agent, or Firm* — Perkins Coie LLP (57) ABSTRACT

The present disclosure discloses a high voltage semiconductor device and the associated methods of manufacturing. In one embodiment, the high voltage semiconductor device comprises: an epitaxial layer, a first low voltage well formed in the epitaxial layer; a second low voltage well formed in the epitaxial layer; a high voltage well formed in the epitaxial layer, wherein the second low voltage well is surrounded by the high voltage well; a first highly doping region formed in the first low voltage well; a second highly doping region and a third highly doping region formed in the second low voltage well, wherein the third highly doping region is adjacent to the second highly doping region; a field oxide formed in the epitaxial layer as a shallow-trench isolation structure; and a gate region formed on the epitaxial layer.

6 Claims, 6 Drawing Sheets

HIGH VOLTAGE SEMICONDUCTOR DEVICE AND THE ASSOCIATED METHOD OF MANUFACTURING

TECHNICAL FIELD

The present disclosure relates to semiconductor devices, more specifically, the present disclosure relates to high voltage semiconductor devices with double tubs.

BACKGROUND

Lightly doped wells are used in various body regions of high voltage semiconductor devices to get high breakdown voltage, while highly doped wells are used in various body regions of low voltage semiconductor devices to lower the resistance. Generally speaking, semiconductor devices with highly doped well as the body region have higher threshold voltage, while semiconductor devices with lightly doped well as the body region have lower threshold voltage. So to make a high voltage semiconductor device, most of BCD (Bipolar-CMOS-DMOS) technologies use lightly doped well with a first doping type as the body region and add an additional layer to adjust the threshold voltage to ensure that the high voltage semiconductor device has a consistent threshold with the low voltage semiconductor device, which increases cost.

Another prior technology uses lightly doped well with a second doping type as the drain region and use low voltage well with the first doping type as the body region. In this case, the threshold voltage adjust layer is not needed, but still an additional well with the second doping type is required, which also increases cost.

SUMMARY

It is an object of the present disclosure to provide an improved high voltage semiconductor device, which solves the above problems.

In accomplishing the above and other objects, there has been provided, in accordance with an embodiment of the present disclosure, a high voltage semiconductor device, comprising: an epitaxial layer with a second doping type; a first low voltage well with the second doping type, wherein the first low voltage well is formed in the epitaxial layer; a second low voltage well with a first doping type, wherein the second low voltage well is formed in the epitaxial layer; a high voltage well with the first doping type, wherein the high voltage well is formed in the epitaxial layer, and wherein the second low voltage well is surrounded by the high voltage well; a first highly doping region with the second doping type, wherein the first highly doping region is formed in the first low voltage well; a second highly doping region with the second doping type, wherein the second highly doping region is formed in the second low voltage well; a third highly doping region with the first doping type, wherein the third highly doping region is formed in the second low voltage well, and wherein the third highly doping region is adjacent to the second highly doping region; a field oxide formed in the epitaxial layer as a shallow-trench isolation structure; and a gate region formed on the epitaxial layer.

In addition, there has been provided, in accordance with an embodiment of the present invention, a method for forming a high voltage semiconductor device, comprising: forming an epitaxial layer with a second doping type on a substrate; forming a high voltage well with a first doping type in the epitaxial layer; forming a field oxide in the epitaxial layer; forming a first low voltage well with the second doping type, and a second low voltage well with the first doping type in the epitaxial layer, wherein the second low voltage well is surrounded by the high voltage well; forming a gate region on the epitaxial layer; forming a first highly doping region with the second doping type in the first low voltage well; forming a second highly doping region with the second doping type in the second low voltage well; and forming a third highly doping region with the first doping type in the second low voltage well, wherein the third highly doping region is adjacent to the second highly doping region.

Furthermore, there has been provided, in accordance with an embodiment of the present invention, a high voltage semiconductor device, comprising: an epitaxial layer with a second doping type; a first low voltage well with the second doping type, wherein the first low voltage well is formed in the epitaxial layer; a second low voltage well with a first doping type, wherein the second low voltage well is formed in the epitaxial layer; a high voltage well with the first doping type, wherein the high voltage well is formed in the epitaxial layer, and wherein the second low voltage well is surrounded by the high voltage well; a first highly doping region with the second doping type, wherein the first highly doping region is formed in the first low voltage well; a second highly doping region with the second doping type, wherein the second highly doping region is formed in the second low voltage well; a third highly doping region with the first doping type, wherein the third highly doping region is formed in the second low voltage well, and wherein the third highly doping region is adjacent to the second highly doping region; a field oxide formed on the epitaxial layer; and a gate region formed on the epitaxial layer and on the field oxide.

BRIEF DESCRIPTION OF THE DRAWINGS

The use of the similar reference label in different drawings indicates the same of like components.

DETAILED DESCRIPTION

Embodiments of circuits for high voltage semiconductor devices are described in detail herein. In the following description, some specific details, such as example circuits for these circuit components, are included to provide a thorough understanding of embodiments of the disclosure. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
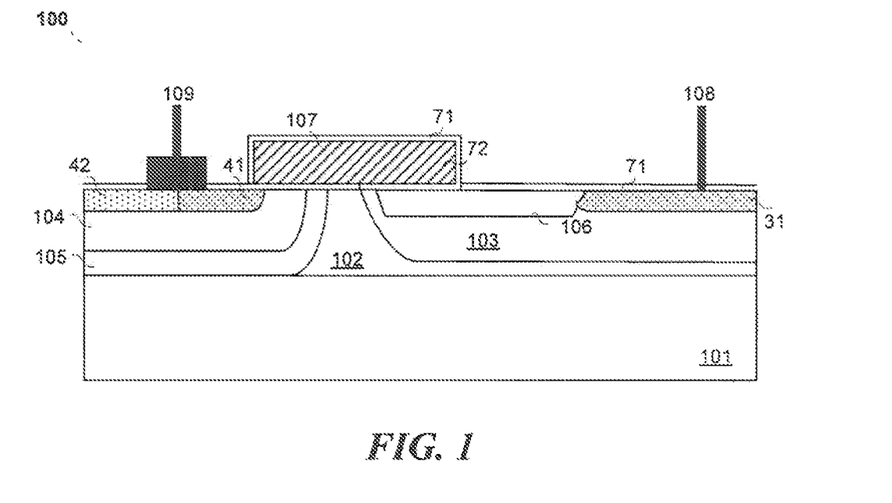
FIG. 1 schematically shows a cross-section view of a high voltage semiconductor device 100 in accordance with an embodiment of the present invention.

FIG. 1 schematically shows a sectional view of a high voltage semiconductor device 100 in accordance with an embodiment of the present invention. In the example of FIG. 1, the high voltage semiconductor device 100 comprises: a buried layer 101 with a first doping type; an epitaxial layer 102 with a second doping type formed on the buried layer 101; a first low voltage well 103 with the second doping type formed in the epitaxial layer 102; a second low voltage well 104 with the first doping type formed in the epitaxial layer 102; a high voltage well 105 with the first doping type formed in the epitaxial layer 102, wherein the second low voltage well 104 is surrounded by the high voltage well 105; a first highly doping region 31 with the second doping type formed in the first low voltage well 103; a second highly doping region 41 with the second doping type formed in the second low voltage well 104; a third highly doping region 42 with the first doping type formed in the second low voltage well 104, wherein the third highly doping region 42 is adjacent to the second highly doping region 41; a field oxide 106 formed in the epitaxial layer 102 as a shallow-trench isolation (STI) structure; and a gate region 107 formed on the epitaxial layer 102.

In one embodiment, the low voltage well is a highly doped well, while the high voltage well is a lightly doped well.

In one embodiment, the buried layer 101 is formed on a substrate, wherein the substrate is with the second doping type. In other embodiments, there may be no buried layer 101 in the high voltage semiconductor device 100; and the epitaxial layer 102 is formed directly on the substrate.

In one embodiment, the gate region 107 comprises a gate oxide layer 71 and a polysilicon layer 72.

In one embodiment, the first low voltage well 103 acts as a drain body region, the second low voltage well 104 acts as a source body region, and the high voltage well 105 acts as a supporting body region.

In one embodiment, the high voltage semiconductor device 100 further comprises: a drain electrode 108 contacted with the first highly doping region 31; and a source electrode 109 contacted with both the second highly doping region 41 and the third highly doping region 42.

In one embodiment, the second low voltage well 104 has a higher doping concentration than that of the high voltage well 105.

In one embodiment, the high voltage semiconductor device comprises a high voltage PMOS. The first doping type is N-type, and the second doping type is P-type.

In one embodiment, the high voltage semiconductor device comprises a high voltage NMOS. The first doping type is P-type, and the second doping type is N-type.

FIGS. 2A-2H partially schematically show cross-section views of a semiconductor substrate undergoing a process for forming a high voltage semiconductor device in accordance with an embodiment of the present disclosure.

Figure 2A:
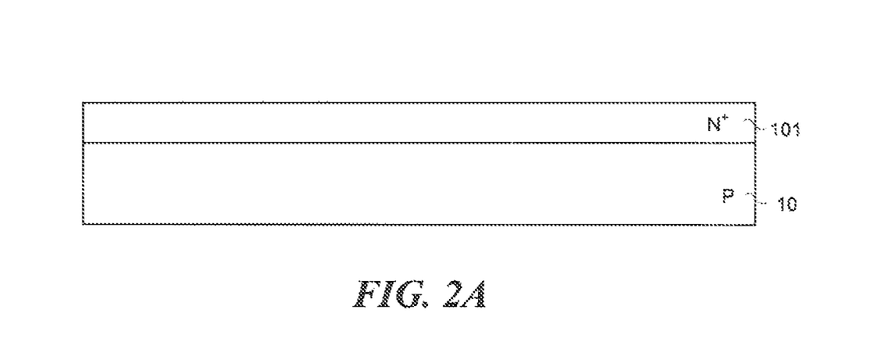
FIGS. 2A-2H partially schematically show cross-section views of a semiconductor substrate undergoing a process for forming a high voltage semiconductor device in accordance with an embodiment of the present disclosure.

As shown in FIG. 2A, the process includes forming a buried layer 101 with a first doping type (e.g., N) on a substrate 10. In one embodiment, the buried layer 102 is highly doped with N-plus ($N^+$). The buried layer 101 may be used to reduce the resistance or used for isolation.

Figure 2B:
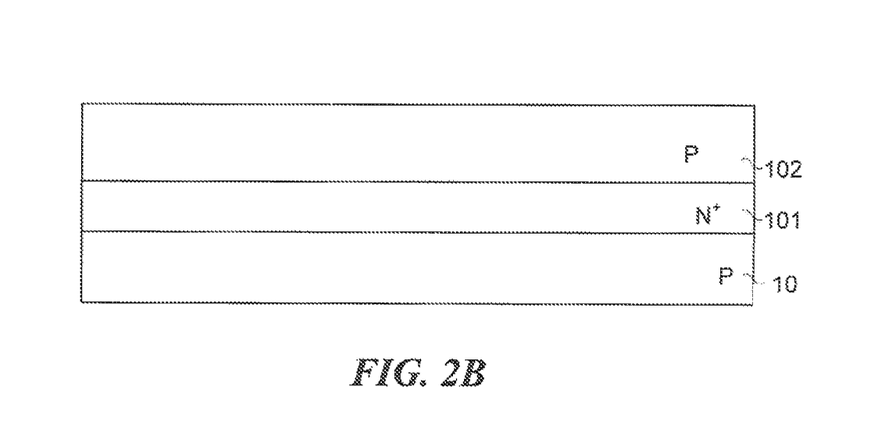

As shown in FIG. 2B, the process includes forming an epitaxial layer 102 with a second doping type (e.g., P) on the buried layer 101. In one embodiment, the epitaxial layer 102 may be formed by deposition technique such as chemical vapor deposition (CVD), plasma enhance chemical vapor deposition (PECVD), atomic layer deposition (ALD), liquid phase epitaxy, and/or other suitable deposition techniques. In one embodiment, the process may not include the step of forming the buried layer 101; and the epitaxial layer 102 may be directly formed on the substrate 10.

Figure 2C:
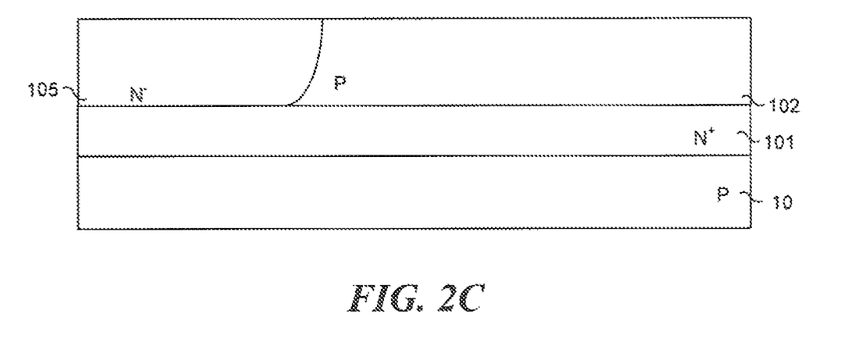

As shown in FIG. 2C, the process includes forming a high voltage well 105 with the first doping type (e.g., N) in the epitaxial layer 102. In one embodiment, the high voltage well 105 is lightly doped (e.g., N). In one embodiment, the high voltage well 105 may be formed by diffusion technology or implantation technology.

Figure 2D:
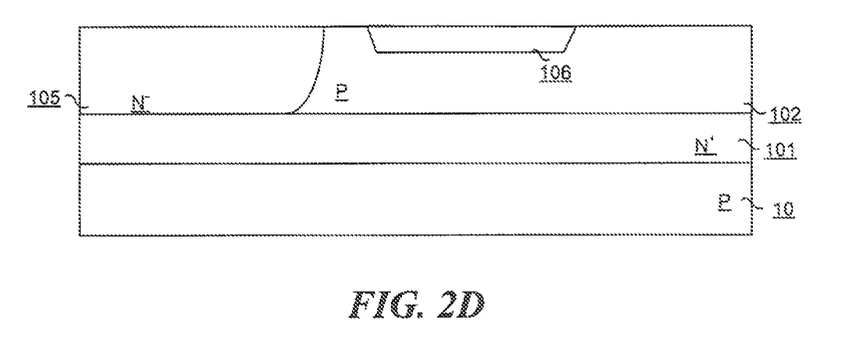

As shown in FIG. 2D, the process includes forming a field oxide 106 in the epitaxial layer 102, wherein the field oxide 106 is formed as a shallow-trench isolation structure. In one embodiment, the field oxide 106 may be formed by wet oxidation technique.

Figure 2E:
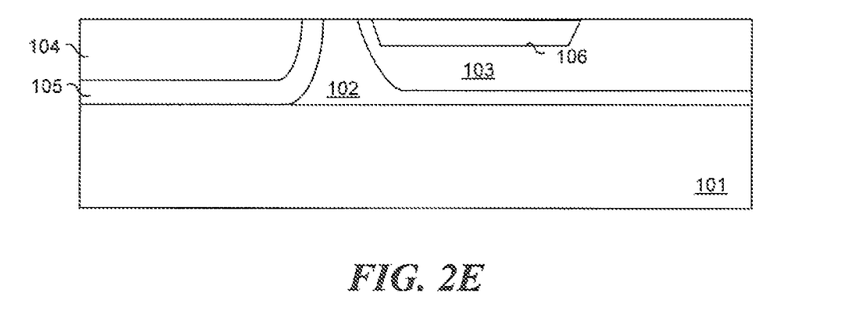

As shown in FIG. 2E, the process includes forming a first low voltage well 103 with the second doping type (e.g., P), and a second low voltage well 104 with the first doping type (e.g., N) in the epitaxial layer 102, wherein the second low voltage well 104 is surrounded by the high voltage well 105. In one embodiment, the first low voltage well 103 acts as a drain body region of the high voltage semiconductor device; the second low voltage well 104 acts as a source body region of the high voltage semiconductor device; and the high voltage well 105 acts as a supporting body region to the source body region. In one embodiment, the first low voltage well 103 extend out of the field oxide 106. In one embodiment, the first low voltage well 103 and the second low voltage well 104 may be formed by diffusion technology or implantation technology.

Figure 2F:
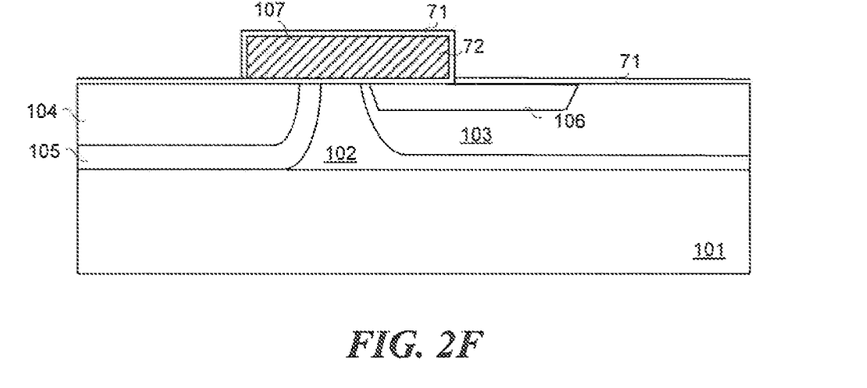

As shown in FIG. 2F, the process includes forming a gate region 107 on the epitaxial layer 102. In one embodiment, the gate region 107 may be formed by dry oxidation technology. In one embodiment, the gate region 107 comprises a gate oxide layer 71 and a polysilicon layer 72.

Figure 2G:
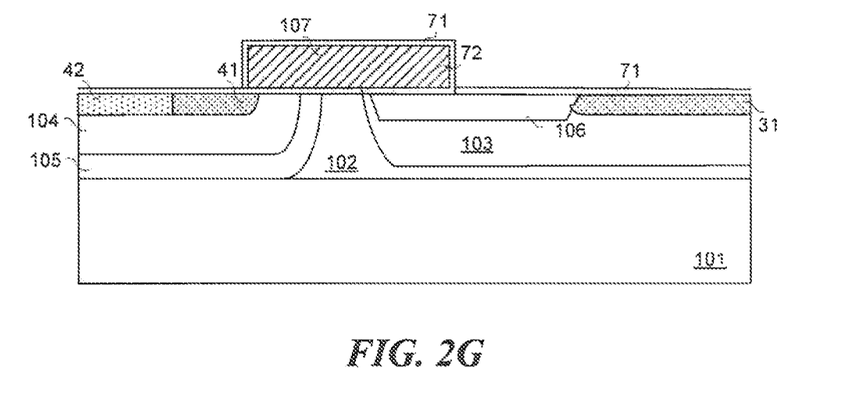
Figure 2H:
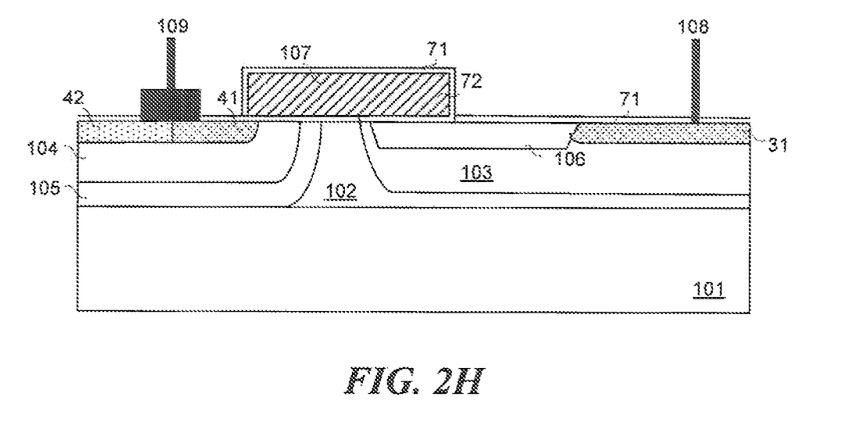

As shown in FIG. 2G, the process includes forming a first highly doping region 31 with the second doping type (e.g., P) in the first low voltage well 103, forming a second highly doping region 41 with the second doping type (e.g., P) in the second low voltage well 104; and forming a third highly doping region 42 with the first doping type (e.g., N) in the second low voltage well 104, wherein the third highly doping region 42 is adjacent to the second highly doping region 41. In one embodiment, the first highly doping region 31, the second highly doping region 41 and the third highly doping region 42 may be formed by implantation technology As shown in FIG. 2H, the process includes forming a drain electrode 108 contacted with the first highly doping region 31, and forming a source electrode 109 contacted with both the second highly doping region 41 and the third highly doping region 42.

Figure 3:
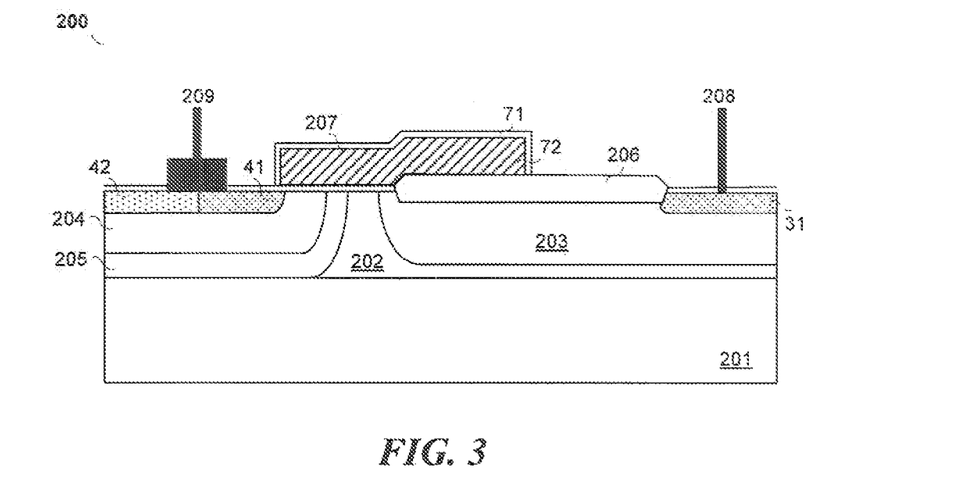
FIG. 3 schematically shows a cross-section view of a high voltage semiconductor device 200 in accordance with an embodiment of the present invention.

FIG. 3 schematically shows a sectional view of a high voltage semiconductor device 200 in accordance with an embodiment of the present invention. Compared to the high voltage semiconductor device 100 in FIG. 1, the high voltage semiconductor device 200 in FIG. 3 has no STI structure. Specifically speaking, in the example of FIG. 3, the high voltage semiconductor device 200 comprises: a buried layer 201 with a first doping type; an epitaxial layer 202 with a second doping type formed on the buried layer 201; a first low voltage well 203 with the second doping type formed in the epitaxial layer 202; a second low voltage well 204 with the first doping type formed in the epitaxial layer 202; a high voltage well 205 with the first doping type formed in the epitaxial layer 202, wherein the second low voltage well 204 is surrounded by the high voltage well 205; a first highly doping region 31 with the second doping type formed in the first low voltage well 203; a second highly doping region 41 with the second doping type formed in the second low voltage well 204; a third highly doping region 42 with the first doping type formed in the second low voltage well 204, wherein the third highly doping region 42 is adjacent to the second highly doping region 41; a field oxide 206 formed on the epitaxial layer 202; and a gate region 207 formed on the epitaxial layer 202 and on the field oxide 206.

In one embodiment, the buried layer 201 is formed on a substrate, wherein the substrate is with the second doping type. In other embodiments, there may be no buried layer 201 in the high voltage semiconductor device 200; and the epitaxial layer is formed directly on the substrate.

In one embodiment, the first low voltage well 203 acts as a drain body region, the second low voltage well 204 acts as a source body region, and the high voltage well 205 acts as a supporting body region.

In one embodiment, the high voltage semiconductor device 200 further comprises: a drain electrode 208 contacted with the first highly doping region 31; and a source electrode 209 contacted with both the second highly doping region 41 and the third highly doping region 42.

In one embodiment, the second low voltage well 204 has a higher doping concentration than that of the high voltage well 205.

In one embodiment, the high voltage semiconductor device 200 comprises a high voltage PMOS. The first doping type is N-type, and the second doping type is P-type.

FIGS. 4A-4G partially schematically show cross-section views of a semiconductor substrate undergoing a process for forming a high voltage semiconductor device in accordance with an embodiment of the present disclosure.

Figure 4A:
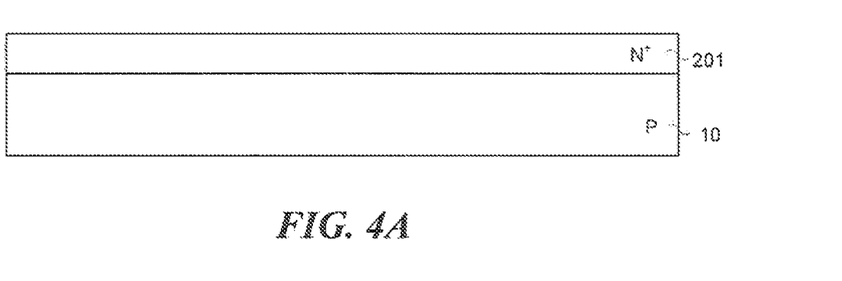
FIGS. 4A-4G partially schematically show cross-section views of a semiconductor substrate undergoing a process for forming a high voltage semiconductor device in accordance with an embodiment of the present disclosure.

As shown in FIG. 4A, the process includes forming a buried layer 201 with a first doping type (e.g., N) on a substrate 10. In one embodiment, the buried layer 102 is highly doped with N-plus ($N^+$). The buried layer 201 may be used to reduce the resistance or used for isolation.

Figure 4B:
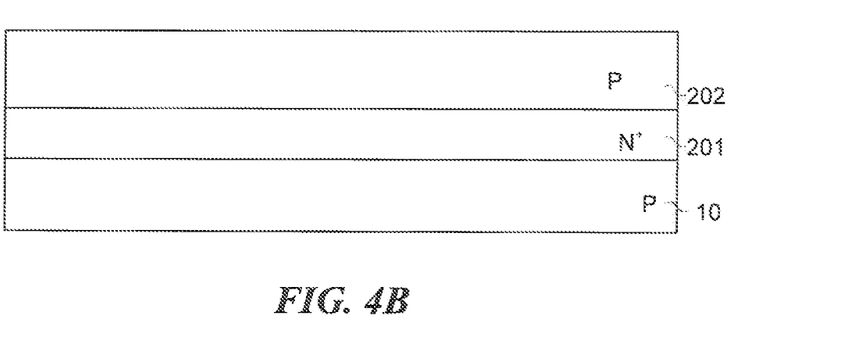

As shown in FIG. 4B, the process includes forming an epitaxial layer 202 with a second doping type (e.g., P) on the buried layer 201. In one embodiment, the epitaxial layer 202 may be formed by deposition technique such as chemical vapor deposition (CVD), plasma enhance chemical vapor deposition (PECVD), atomic layer deposition (ALD), liquid phase epitaxy, and/or other suitable deposition techniques. In one embodiment, the process may not include the step of forming the buried layer 201; and the epitaxial layer 202 is directly formed on the substrate 10.

Figure 4C:
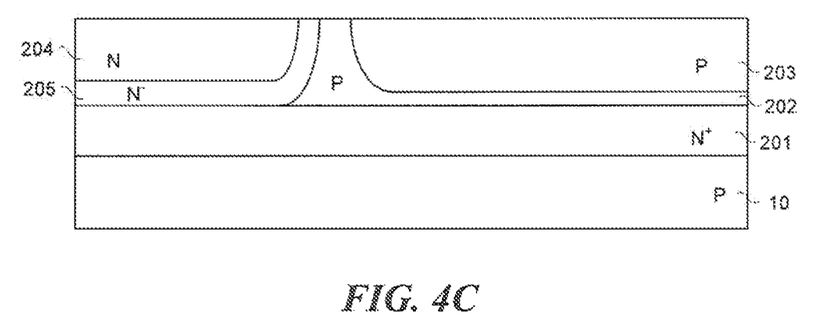

As shown in FIG. 4C, the process includes forming a first low voltage well 203 with the second doping type (e.g., P), a second low voltage well 204 with the first doping type (e.g., N) and a high voltage well 205 with the first doping type (e.g., N) in the epitaxial layer 202, wherein the second low voltage well 204 is surrounded by the high voltage well 205. In one embodiment, the first low voltage well 203, the second low voltage well 204 and the high voltage well 205 may be formed by diffusion technology or implantation technology. In one embodiment, the first low voltage well 203 acts as a drain body region of the high voltage semiconductor device; the second low voltage well 204 acts as a source body region of the high voltage semiconductor device; and the high voltage well 205 acts as a supporting body region to the source body region. In one embodiment, the second low voltage well 204 has a higher doping concentration than that of the high voltage well 205.

Figure 4D:
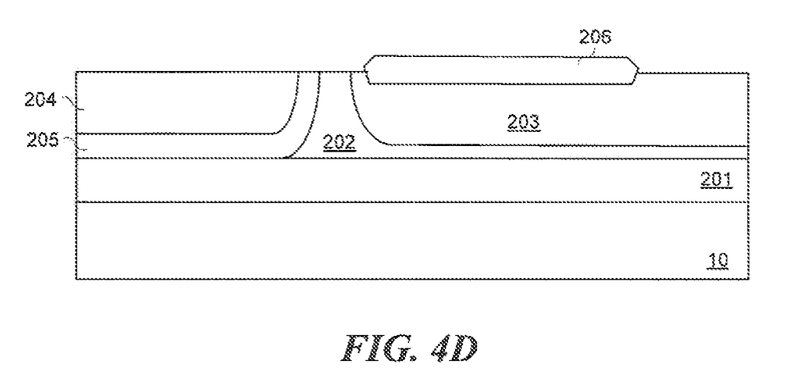

As shown in FIG. 4D, the process includes forming a field oxide 206 on the epitaxial layer 202. In one embodiment, the field oxide 206 may be formed by wet oxidation technology.

Figure 4E:
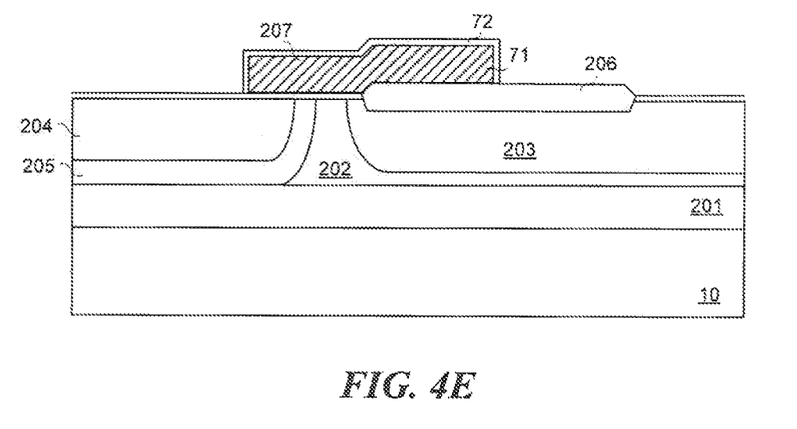

As shown in FIG. 4E, the process includes forming a gate region 207 on the epitaxial layer 202 and on the field oxide 206. In one embodiment, the gate region 207 may be formed by dry oxidation technology. In one embodiment, the gate region 207 comprises a gate oxide layer 71 and a polysilicon layer 72.

Figure 4F:
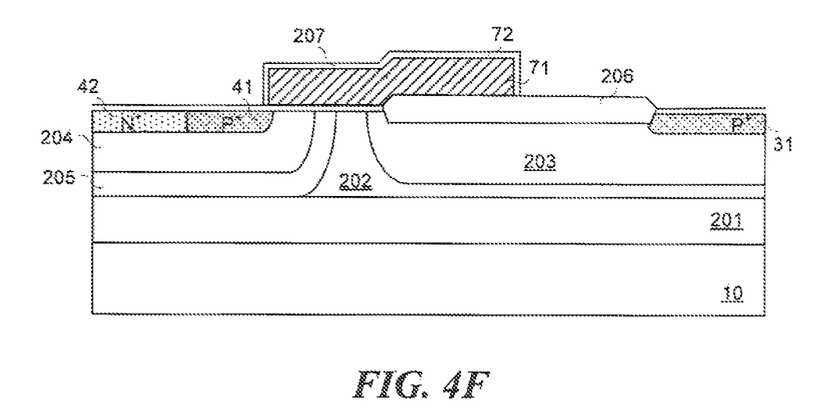

As shown in FIG. 4F, the process includes forming a first highly doping region 31 with the second doping type (e.g., P) in the first low voltage well 203, forming a second highly doping region 41 with the second doping type (e.g., P) in the second low voltage well 204; and forming a third highly doping region 42 with the first doping type (e.g., N) in the second low voltage well 204, wherein the third highly doping region 42 is adjacent to the second highly doping region 41. In one embodiment, the first highly doping region 31, the second highly doping region 41 and the third highly doping region 42 may be formed by implantation technology.

Figure 4G:
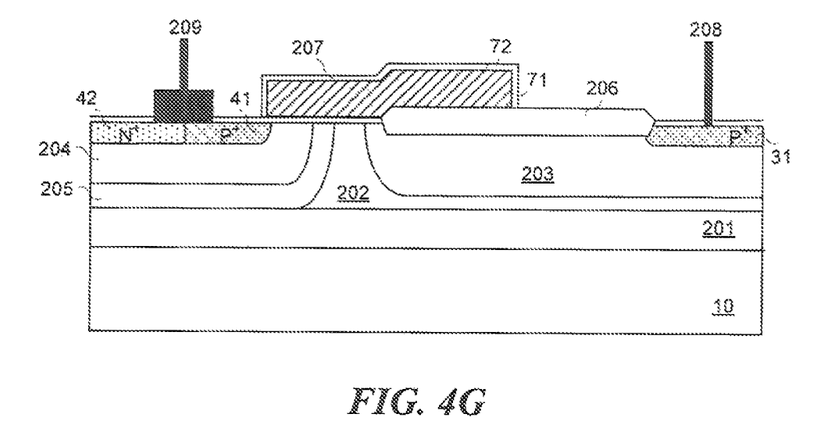

As shown in FIG. 4G, the process includes further forming a drain electrode 208 contacted with the first highly doping region 31, and forming a source electrode 209 contacted with both the second highly doping region 41 and the third highly doping region 42.

Several embodiments of the foregoing high voltage semiconductor device needs fewer layers compared to conventional technique discussed above. Unlike the conventional technique, several embodiments of the foregoing high voltage semiconductor device use a highly doped well with a first doping type (the second low voltage well 104 or 204) as the main body region, which ensures that the high voltage semiconductor device has a consistent threshold with low voltage semiconductor devices; use highly doped well with a second doping type (the first low voltage well 103 or 203) as the drain body region, which lowers the resistance; and use lightly doped well with the first doping type (the high voltage well 105 or 205) as the supporting body region, which increases the breakdown voltage; where the highly doped well with the first doping type (the second low voltage well 104 or 204) and the highly doped well with the second doping type first low voltage well 103 or 203) are commonly used for low voltage semiconductor devices and other devices; and the lightly doped well with the first doping type (the high voltage well 105 or 205) is commonly used for DMOS and other devices. Thus the high voltage semiconductor device discussed in the present disclosure could be used with any BCD technologies with low voltage well with the first doping type, middle voltage/high voltage well with the first doping type, and low voltage well with the second doping type layers.

This written description uses examples to disclose the disclosure, including the best mode, and also to enable a person skilled in the art to make and use the disclosure. The patentable scope of the disclosure may include other examples that occur to those skilled in the art.

We claim:
1. A high voltage PMOS, comprising:
a P-type epitaxial layer;
an N-type buried layer under the epitaxial layer;
a P-type first low voltage well acting as a drain body region, wherein the first low voltage well is formed in the epitaxial layer;
an N-type second low voltage well acting as a source body region, wherein the second low voltage well is formed in the epitaxial layer;
an N-type high voltage well acting as a supporting body region, wherein the high voltage well is formed in the epitaxial layer, and wherein the second low voltage well is surrounded by the high voltage well, and further wherein the first low voltage well and the high voltage well are not adjacent and separated by the epitaxial layer;

a P-type first highly doping region, wherein the first highly doping region is formed in the first low voltage well;

a P-type second highly doping region, wherein the second highly doping region is formed in the second low voltage well;

an N-type third highly doping region, wherein the third highly doping region is formed in the second low voltage well, and wherein the third highly doping region is adjacent to the second highly doping region;

a field oxide formed in the epitaxial layer as a shallow-trench isolation structure; and a gate region formed on the epitaxial layer.

2. The high voltage PMOS of claim 1, wherein the second low voltage well has a higher doping concentration than that of the high voltage well.

3. The high voltage PMOS of claim 1, further comprising:

a drain electrode contacted with the first highly doping region; and a source electrode contacted with both the second highly doping region and the third highly doping region.

4. A high voltage PMOS, comprising:

a P-type epitaxial layer;

an N-type buried layer under the epitaxial layer;

a P-type first low voltage well acting as a drain body region, wherein the first low voltage well is formed in the epitaxial layer;

an N-type second low voltage well acting as a source body region, wherein the second low voltage well is formed in the epitaxial layer;

an N-type high voltage well acting as a supporting body region, and wherein the second low voltage well is surrounded by the high voltage well, and further wherein the first low voltage well and the high voltage well are not adjacent and separated by the epitaxial layer;

a P-type first highly doping region, wherein the first highly doping region is formed in the first low voltage well;

a P-type second highly doping region, wherein the second highly doping region is formed in the second low voltage well;

an N-type third highly doping region, wherein the third highly doping region is formed in the second low voltage well, and wherein the third highly doping region is adjacent to the second highly doping region;

a field oxide formed on the epitaxial layer; and a gate region formed on the epitaxial layer and on the field oxide.

5. The high voltage PMOS of claim 4, further comprising:

a drain electrode contacted with the first highly doping region; and a source electrode contacted with both the second highly doping region and the third highly doping region.

6. The high voltage PMOS of claim 4, wherein the second low voltage well has a higher doping concentration than that of the high voltage well.

\* \* \* \* \*